United States Patent
Shiga et al.

(10) Patent No.: US 6,778,443 B2
(45) Date of Patent: Aug. 17, 2004

(54) NON-VOLATILE SEMICONDUCTOR MEMORY DEVICE HAVING MEMORY BLOCKS PRE-PROGRAMMED BEFORE ERASED

(75) Inventors: Hitoshi Shiga, Yokohama (JP); Tokumasa Hara, Tachikawa (JP); Tadayuki Taura, Zushi (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 34 days.

(21) Appl. No.: 10/328,149

(22) Filed: Dec. 23, 2002

(65) Prior Publication Data

US 2003/0117886 A1 Jun. 26, 2003

(30) Foreign Application Priority Data

Dec. 25, 2001 (JP) .......................... 2001-392712

(51) Int. Cl.[7] ............................................. G11C 16/04
(52) U.S. Cl. ............................. 365/185.33; 365/185.11; 365/185.24
(58) Field of Search ........................ 365/185.11, 185.22, 365/185.24, 185.29, 185.33

(56) References Cited

U.S. PATENT DOCUMENTS

| | | | | |
|---|---|---|---|---|
| 5,327,384 A | * | 7/1994 | Ninomiya | 365/185.22 |
| 5,418,752 A | | 5/1995 | Harari et al. | 365/218 |
| 5,805,501 A | * | 9/1998 | Shiau et al. | 365/185.29 |
| 6,172,915 B1 | * | 1/2001 | Tang et al. | 365/185.29 |
| 6,377,491 B2 | * | 4/2002 | Otani et al. | 365/185.29 |
| 6,504,765 B1 | * | 1/2003 | Joo | 365/185.29 |

* cited by examiner

*Primary Examiner*—Son Mai
(74) *Attorney, Agent, or Firm*—Hogan & Hartson, LLP

(57) ABSTRACT

A non-volatile semiconductor memory device comprises a plurality of blocks each having a plurality of memory cells to be erased at a time and a decoder for selecting the memory cells, each of the blocks having a block decoder for latching a selection signal thereof in pre-programming and for selecting all of the latched blocks by the selection signal at the same time, a sense amplifier, and an address control circuit for controlling a sequence, the sequence including counting addresses of the memory cells in erasing and erasing all of the selected memory cells after pre-programming, all of the blocks having the latched selection signal being controlled to be collectively erased by the address control circuit.

11 Claims, 12 Drawing Sheets

Program bias

Erasing bias

Convergence bias

NON-VOLATILE SEMICONDUCTOR MEMORY DEVICE HAVING MEMORY BLOCKS PRE-PROGRAMMED BEFORE ERASED

CROSS-REFERENCE TO RELATED APPLICATIONS

This application is based upon and claims the benefit of priority from the prior Japanese Patent Application No. 2001-392712, filed Dec. 25, 2001, the entire contents of which are incorporated herein by reference.

BACKGROUND OF THE INVENTION

1. Field of the Invention

The present invention relates to a non-volatile semiconductor memory device and, more particularly to, an erasing function of a flash memory.

2. Description of the Related Art

A flash memory has been suggested which simultaneously erases data stored in a memory cell array, as a conventional non-volatile semiconductor memory device. An erase sequence of a conventional NOR-type flash memory is shown in FIG. 13. By the sequence, erase-unit blocks are selected sequentially and, to have data stored therein erased, undergo a pre-programming sub-sequence and an erase sub-sequence consecutively. Here, pre-programming refers to putting all the memory cells in a block into a written-in state (state "0") in order to execute the erase uniformly.

That is, as shown in FIG. 13, for example, to erase data stored in three blocks of first, second, and third blocks, after erase execution is confirmed, the first block is pre-programmed and subsequently undergoes data erase and then, after the erase is confirmed, the second block is pre-programmed and subsequently undergoes data erase. After the erase is confirmed, the third block is pre-programmed and subsequently undergoes data erase. When n number of blocks are provided, similarly, each time erase execution is confirmed, a sequence of pre-programming and data erase is executed.

In this case, the process checks for whether a given block is selected by a command to undergo data erase or to be protected therefrom (data erase-inhibited) and, if it is not to undergo data erase, does not pre-program the block and, otherwise, pre-programs it.

Furthermore, pre-programming is executed for each address or for a few addresses sequentially by counting up row and column addresses in a relevant block.

Upon completion of pre-programming of all the memory cells in the block, the process confirms the final address to then execute data erase.

FIGS. 14A–14C show one example of a method of executing write-in (programming) on transistors making up a memory cell and applying an erasing bias thereon. In this case, in order to apply the erasing bias, a high electric field is applied between a silicon substrate and a word line, instead of which, however, such a method may be used as to apply a high electric field between a word line and a source in order to execute data erase.

A memory cell shown in FIGS. 14A–14C comprises a source 102, a drain 103, a floating gate 104, and a control gate 105 which are formed in or on a silicon substrate 101.

The programming is executed by applying a program bias such as shown in FIG. 14A to the memory cell to inject hot electrons from a side of the drain 103 formed in the silicon substrate 101 into the floating gate 104 so that they may be trapped therein. In this case, a large current flows into each memory cell, so that the programming cannot be executed on a number of memory cells simultaneously.

The erase is executed as verifying it for each bit. It is to be noted that pre-programming may also be executed as verifying it for each bit.

In verification, if even one bit of memory cell encounters a verification failure (state where data in the memory cell is not completely erased), the process applies such an erasing bias as shown in FIG. 14B again on all the memory cells in a relevant block and releases electrons trapped in the floating gate 104 into the silicon substrate 101, thus erasing data stored in the memory cells simultaneously. The process repeats this simultaneous data erase and verification process until all the memory cells in the block pass the verification step.

Furthermore, in verification, until it confirms the final address, the process counts up the row/column addresses in a relevant block using an address count-up step. When it has completed simultaneous data erase and verification of the relevant block, the process subsequently carries out a series of erase sequences on a block to undergo data erase next.

In such a manner, the process repeats pre-programming, simultaneous erase, and verification for each of the blocks until it confirms the final block and then ends the erase sequence.

FIG. 15 shows a diagram of an equivalent circuit of a NOR-type flash memory array. The NOR-type flash memory shown in FIG. 15 comprises a memory cell $M_{i,j}$ (i=1, 2 and j=1, 2), a selection gate $S_i$, a word line $WL_i$ (which is shown in the case of i=1, 2), a bit line BL, and a source line S.

Since the NOR-type flash memory has such an array configuration as shown in FIG. 15, if the threshold value of a memory cell is reduced excessively because of the erase, the bit line BL is supplied with a current nevertheless the word line $WL_i$ is in an unselected state at the low level ("L"), so that there are some cases where "1" is always read out despite that a word line other than $WL_i$ is selected. In such a case, therefore, weak programming is executed after the erase.

For example, if, as shown in FIG. 14C illustrating a convergence bias, only the bit line is supplied with a high voltage (where the drain 103 is at 5V) in a condition where the word lines are all in an unselected state (where the control gate 105 is at 0V), a current is concentrated to such a memory cell of those on the same bit line as to have a lower threshold value due to the excessive erase, so that this overerased memory cell can be given a little higher threshold voltage.

In the case of a program bias shown in FIG. 14A, the programming ends in 5–10 μs, whereas in the case of an erasing bias shown in FIG. 14B, the erase takes 10–100 ms to be completed. As a result, in the case of a 64K byte-block, for example, it takes 500–1000 ms of time to complete an erase sequence.

As described above, the conventional non-volatile semiconductor memory device has a sequence for executing pre-programming and subsequent erase for each block and, therefore, has a long time required to complete the erase sequence.

BRIEF SUMMARY OF THE INVENTION

According to a first aspect of the present invention, a non-volatile semiconductor memory device comprises:

a plurality of blocks each having a plurality of memory cells to be erased at a time and a decoder for selecting the memory cells, each of the blocks having a block decoder for latching a selection signal thereof in pre-programming and for selecting all of the latched blocks by the selection signal at the same time;

a sense amplifier; and an address control circuit for controlling a sequence, the sequence including counting addresses of the memory cells in erasing and erasing all of the selected memory cells after pre-programming, all of the blocks having the latched selection signal being controlled to be collectively erased by the address control circuit.

According to a second aspect of the present invention, a non-volatile semiconductor memory device comprises:

a plurality of blocks each having a plurality of memory cells to be erased at a time and a decoder for selecting the memory cells, each of the blocks having a block decoder for latching a selection signal thereof in pre-programming and for selecting all of the latched blocks by the selection signal at the same time;

a sense amplifier; and an address control circuit for controlling a sequence, the sequence including counting addresses of the memory cells in erasing and erasing all of the selected memory cells in a predetermined number of blocks after pre-programming, the predetermined number of the blocks having the latched selection signal being controlled to be collectively erased by the address control circuit.

According to a third aspect of the present invention, a method for executing an erase sequence on a non-volatile semiconductor memory device including a plurality of blocks each having a plurality of memory cells, comprising:

confirming erase execution of a first block to be pre-programmed and then pre-programming the first block;

confirming erase execution of a next block and then pre-programming the next block;

similarly confirming erase execution of further next blocks one by one and then pre-programming the further next blocks one by one; and then, executing collective erase for each of the blocks.

DETAILED DESCRIPTION OF THE INVENTION

The following will describe embodiments of the present invention with reference to drawings.

Figure 1:
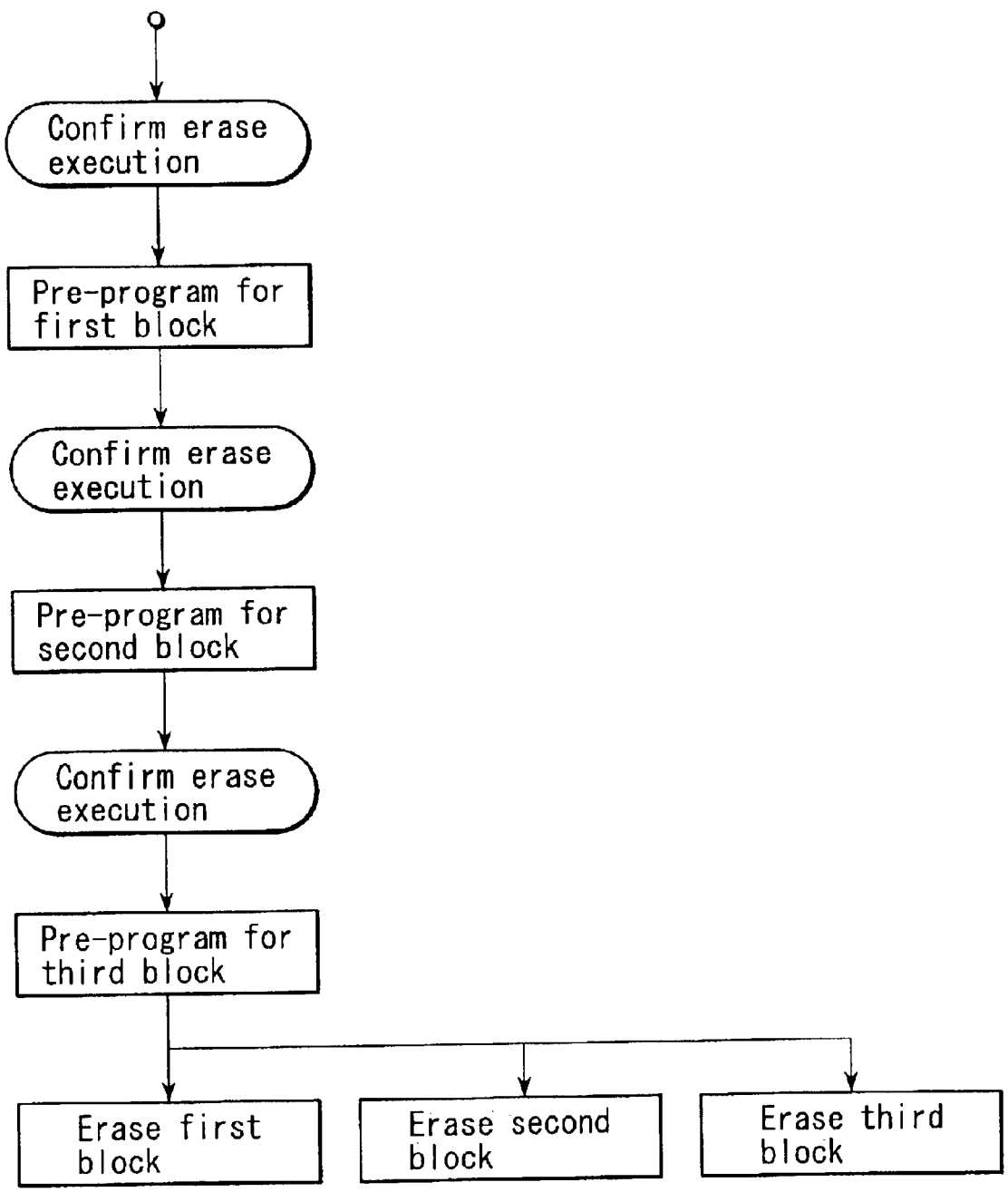
FIG. 1 shows a basic erase sequence for a non-volatile semiconductor memory device.

FIG. 1 shows a basic erase sequence for a non-volatile semiconductor memory device. To erase data stored in three blocks of first, second, and third blocks, for example, after erase execution is confirmed, the first block is pre-programmed and, after the erase is confirmed, the second block is pre-programmed. Then, after the erasure is confirmed, the third block is pre-programmed, after which the erase is carried out for every each of the blocks. When n number of blocks are provided, similarly, each time erase execution is confirmed, a sequence of the pre-programming and the erase is executed.

In pre-programming of each of these blocks, any one of these which is subject to data erase is added a flag to thereby undergo the erase in an erase sequence. If any one of these blocks need not be pre-programmed, it is skipped to pre-program the next block.

Figure 2:
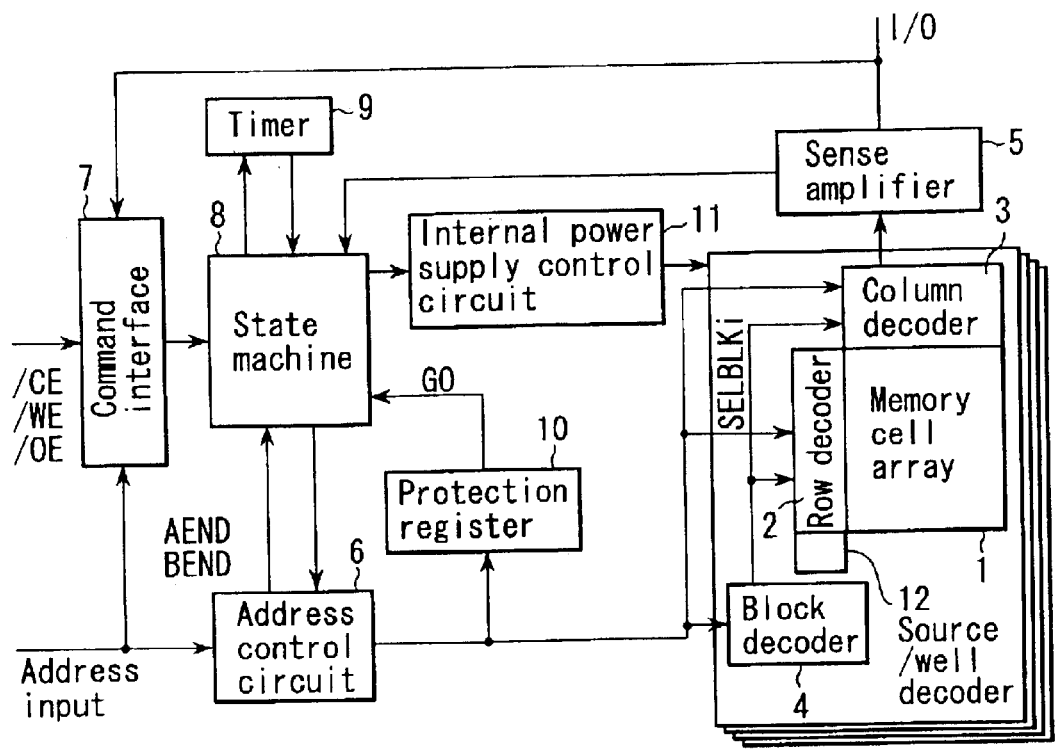
FIG. 2 is a block diagram for showing a configuration of a non-volatile semiconductor memory device according to a first embodiment.

FIG. 2 shows a block configuration of a non-volatile semiconductor memory device according to a first embodiment. This non-volatile semiconductor memory device comprises a memory cell array 1, a row decoder 2, a column decoder 3, a block decoder 4, a sense amplifier 5, an address control circuit 6, a command interface 7, a state machine 8, a timer 9, a protection register 10, and an internal power supply control circuit 11.

Upon reception of a predetermined command from an outside of a chip, the command interface 7 transfers to the state machine 8 a trigger signal which starts the sequence. The state machine 8 varies control signals output from the address control circuit 6 and the internal power-supply control circuit 11, thereby to execute automatic data erase.

As shown in FIG. 2, the memory cell array 1 is provided by units (hereinafter referred to as blocks) in each of which memory cells are supplied with an erasing bias simultaneously, wherein the blocks are each provided with the row decoder 2, the column decoder 3, and a source/well decoder 12 in order to select any one of the memory cells, so that data stored in each cell thus selected is sent to the sense amplifier 5 and output to an I/O. Furthermore, the blocks are each provided with the block decoder 4 to output a block selection signal $SELBLK_i$.

When any one of the blocks is selected, only its row decoder 2 and column decoder 3 are activated to select a memory cell specified by a row address and a column address selected by these decoders respectively.

Figure 3:
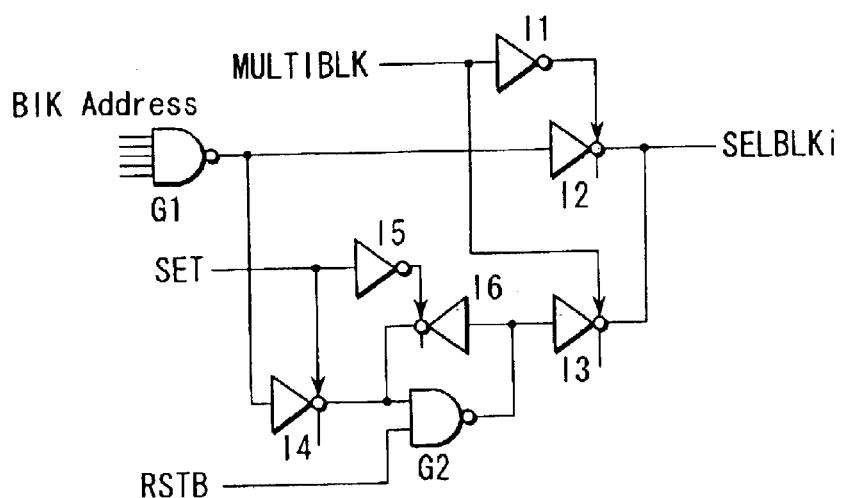
FIG. 3 is a diagram for showing one example of a block decoder of the non-volatile semiconductor memory device according to the first embodiment.
Figure 4:
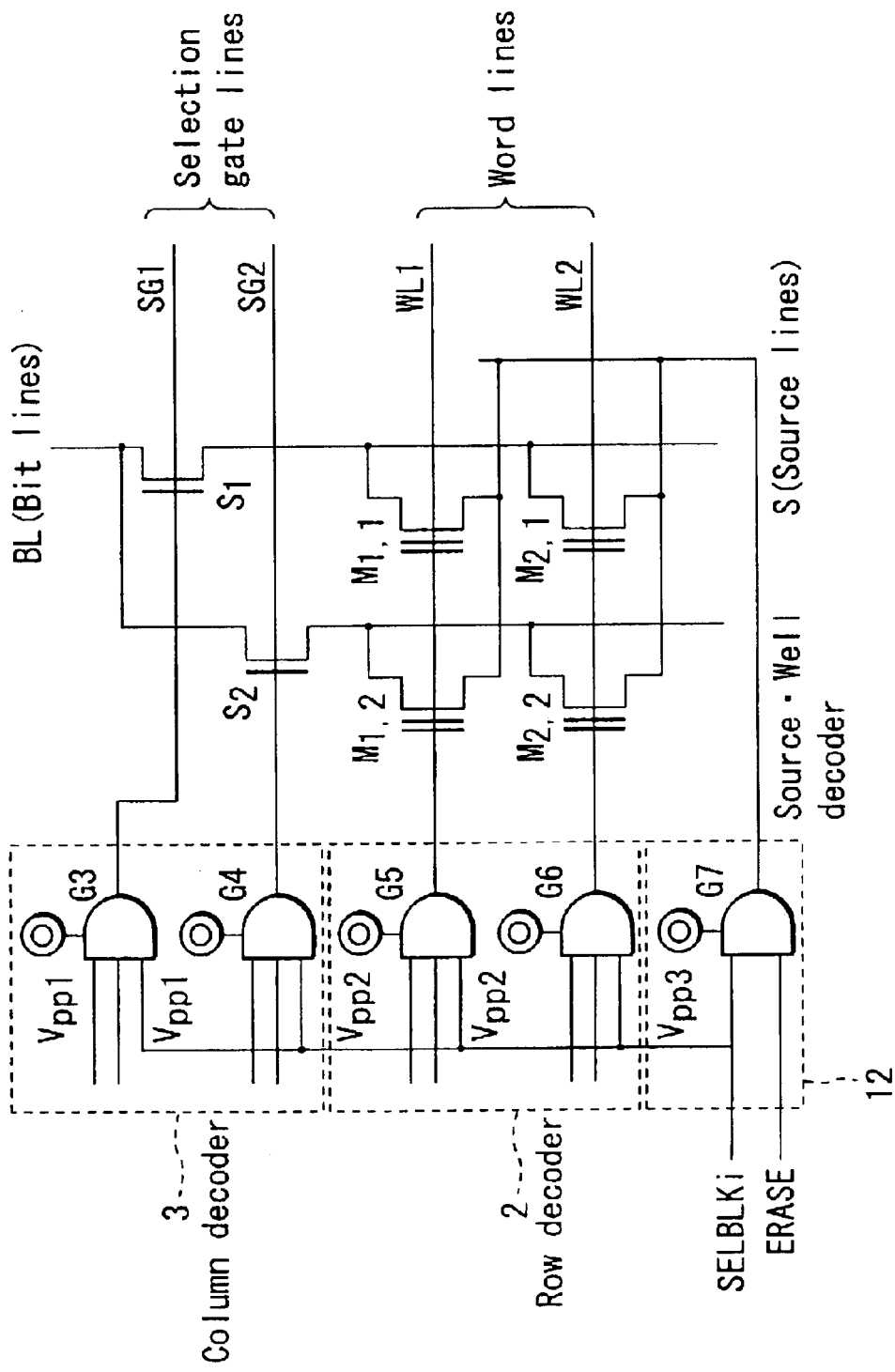
FIG. 4 is a circuit diagram for showing a block selection configuration of the non-volatile semiconductor memory device according to the first embodiment.

An example of a block decoder circuit is shown in FIG. 3 and a logical configuration for row and column selection upon reception of the block selection signal SELBLK$_i$, in FIG. 4.

The block decoder of FIG. 3 for outputting the block selection signal SELBLK$_i$ includes a NAND gate G1 which receives a block address (BLK Address), an output unit of an block selection signal SELBLK$_i$ which switches clocked inverters I2 and I3 from each other via an inverter I1 when having received a signal MULTIBLK for block selection, an inverter I4 which receives an output of the NAND gate G1, an inverter I5 which receives a setting signal SET, and a latch circuit comprised of a NAND gate G2 and a clocked inverter I6.

An output of the inverter I4 is controlled by the setting signal SET and connected to one of two terminals of the NAND gate G2. An output of the inverter I5 controls the inverter I6. A reset bar signal RSTB is connected to the other input terminal of the NAND gate G2.

The block decoder shown in FIG. 3 has a function to turn "H" the block selection signal SELBLK$_i$ for all blocks for which "H" is latched in the erase selection latch circuit comprised of G2 and I6 when a signal MULTIBLK for block selection is turned "H".

A block selection configuration provided with row-selection and column-selection functions shown in FIG. 4 comprises the column decoder 3 made up of AND gates G3 and G4, the row decoder 2 made up of AND gates G5 and G6, and the source/well decoder 12 made up of an AND gate G7.

The output of the column decoder 3 is connected to a selection gate line of the memory cell array 1 to select a column in accordance with column addresses, while the output of the row decoder 2 is connected to a word line of the memory cell array 1 to select a word line in accordance with row addresses. Furthermore, the AND gate G7 which constitutes the source/well decoder 12 receives the block selection signal SELBLK$_i$ and an erase signal ERASE and, if both of them are at "H", an erase voltage to a common source line S so that data stored in the cell array can be erased in each of the blocks which is selected by the common source line S.

Power supply terminals of the AND gates constituting the column decoder 3, the row decoder 2, and the source/well decoder 12 are supplied with a plurality of internal power-supply voltages such as $V_{PP1}$, $V_{PP2}$, $V_{PP3}$, etc. from the internal power-supply control circuit 11 shown in FIG. 2, thereby carrying out the programming, the reading, the erasing, etc. to the memory cell array 1 respectively.

Figure 5:
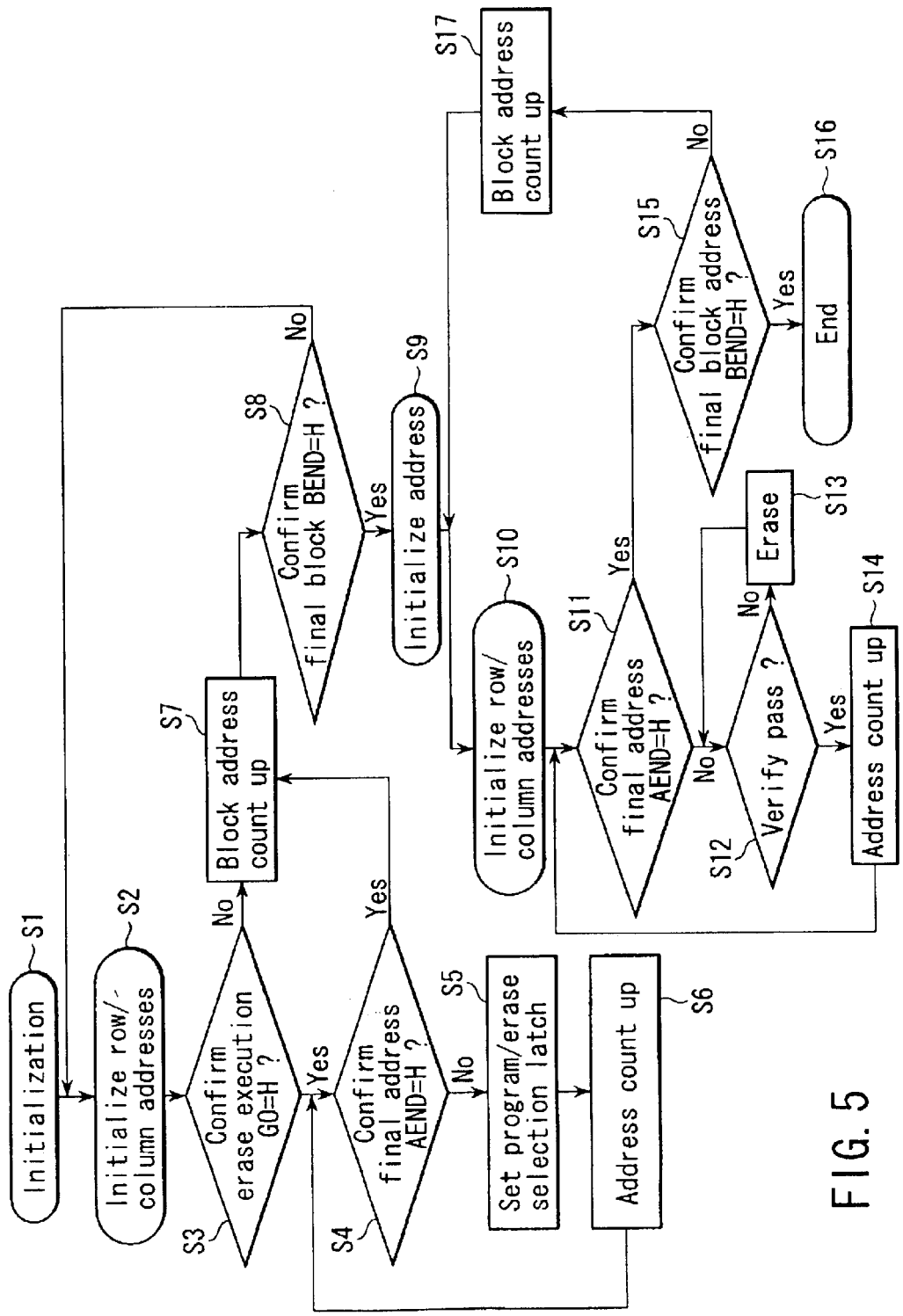
FIG. 5 is a flowchart for showing an erase sequence according to the first embodiment.

The following will describe the erase operation of the non-volatile semiconductor memory device according to the first embodiment with reference to an erasure sequence of FIG. 5.

In the present embodiment, pre-programming is executed for each of blocks and then the erase is carried out for each of the blocks.

That is, receiving a command for erase instruction, the initialization is accomplished at step S1. At step S2, row/column addresses are initialized and also the potential of the internal power-supply control circuit 11 of FIG. 2 is controlled to a programming potential.

At step S3 for erase execution confirmation, it is confirmed whether a given block is a relevant one or not.

Comparing data of the protection register 10 (which is typically made up of an fuse element) shown in FIG. 2 with an address of a selected block, GO=H is sent from the protection register 10 to the state machine 8 during the erase execution. When GO=H is given, pre-programming is executed.

Thereafter, the process goes along step S4 for final address confirmation, step S5 for setting a program and an erasure selection latch, and step S6 for address count-up in this order, thus pre-programming all the memory cells in the block sequentially. At this time, "H" is latched to the erasure selection latch of the block decoder 4 of FIG. 2 provided for each block. That is, a flag is added to the relevant block.

When all of the pre-programming is finished for the block, AEND=H is established at step S4, whereupon the process goes along step S7 where it counts up block addresses and step S8 where it confirms the final block and then goes to the next blocks sequentially to execute the above-mentioned steps of S2 through S6.

It is to be noted that AEND refers to a final row/column address confirmation signal and BEND, a final block confirmation signal.

When all the blocks are pre-programmed completely in such a manner, "H" is latched in the erase selection latch only for such a block as to undergo data erase.

If this block need not be pre-programmed, the process moves from step S3 for confirming the erase execution to step S7 for counting up block addresses.

When the final block is confirmed at step S8, the process goes along step S9 for address initialization and step S10 for row/column address confirmation up to step S11 for confirming the final address of the block. Until AEND becomes "H" in the step 11, step S12 for executing verification, step S13 for erase or step S14 for address count-up are repeated. When AEND=H is obtained, the process goes to step S15 for confirming the final block in accordance with the confirmation signal and then to step S16, at which the erase is ended by the confirmation signal. If the final block is not encountered, the process goes to step S17 for block address count-up, where it executes the erase process.

Figure 14A:
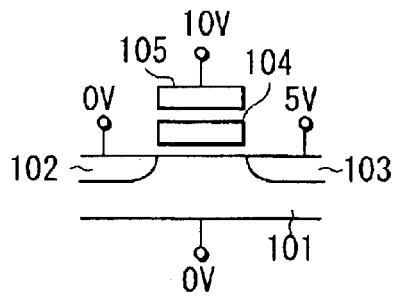
FIGS. 14A to 14C are cross-sectional views for showing bias conditions for the conventional non-volatile semiconductor memory device.
Figure 14B:
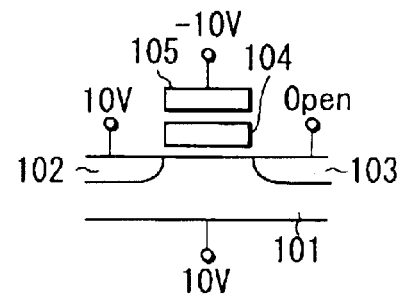

At step S13 for erase execution, the erasing bias as shown in FIG. 14B is applied to the memory cells. For this purpose, all of the rows and columns are kept at an unselected state and the MULTIBLK signal for block selection is turned to "H". Thus, the block selection signal SELBLK$_i$ becomes "H" for all blocks for which "H" is latched to the erase selection latch made up of G2 and I6 shown in FIG. 3.

In this case, the source/well decoder 12 shown in FIG. 4 transfers an internal boosted potential of the internal power-supply control circuit 11 shown in FIG. 2 only to those blocks for which SELBLK$_i$ has been turned "H". Therefore, only the erase-selected blocks are supplied with the erasing bias. In such a manner, a plurality of blocks selected to erase can be erased collectively.

Figure 15:
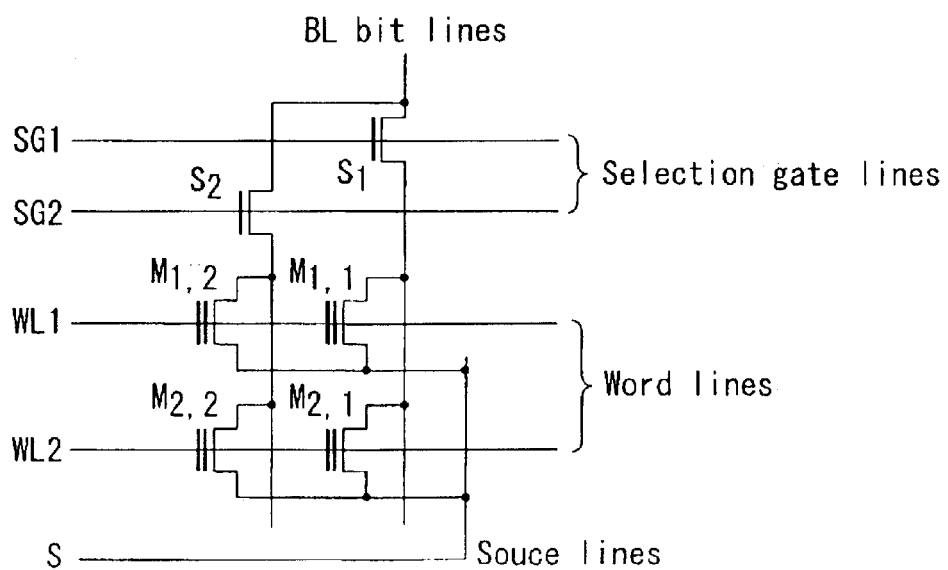
FIG. 15 is a circuit diagram for showing a cell array configuration of the conventional non-volatile semiconductor memory device.

It is to be noted that the erase is executed as verifying the memory cells for each bit at step S12 of FIG. 5. In read-out for verification, if even one bit of memory cell is found not to be in an erased state, the collective erase is executed again on the plurality of blocks selected to erase. The final block is confirmed at step S13 and the erase sequence of FIG. 15 is ended.

As is clear from description of the above-mentioned steps, in the present embodiment, in pre-programming of each block, as at step S3, the process surely confirms the execution of erase of the block and, if the block need not be pre-programmed, skips this block to go to the next block.

Figure 13:
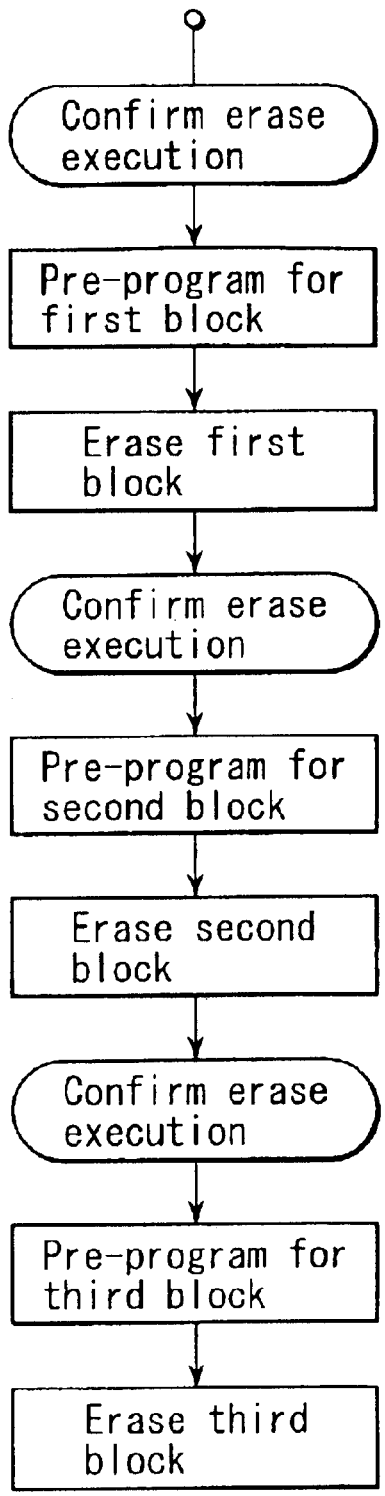
FIG. 13 is a flowchart for showing an erase sequence for a conventional non-volatile semiconductor memory device.

Thus, according to the first embodiment, unlike the conventional erase step shown in FIG. 13, data stored in a plurality of blocks selected to undergo the data erase can be erased collectively, thereby completing the erase sequence for a short time.

The following will describe a second embodiment.

A memory may suffer from a problem that some of memory cells thereof fail to function owing to any of a variety of factors such as dust occurring in manufacturing processes. Therefore, typically redundancy is provided by adding redundant cells to the cell array so that a faulty cell may be replaced by the redundant cell, thus obtaining an acceptable product. Redundancy enables replacement of memory cells in, for example, a word line unit or a bit line unit; in fact, a flash memory may have block redundancy for block-unit replacement.

Figure 6:
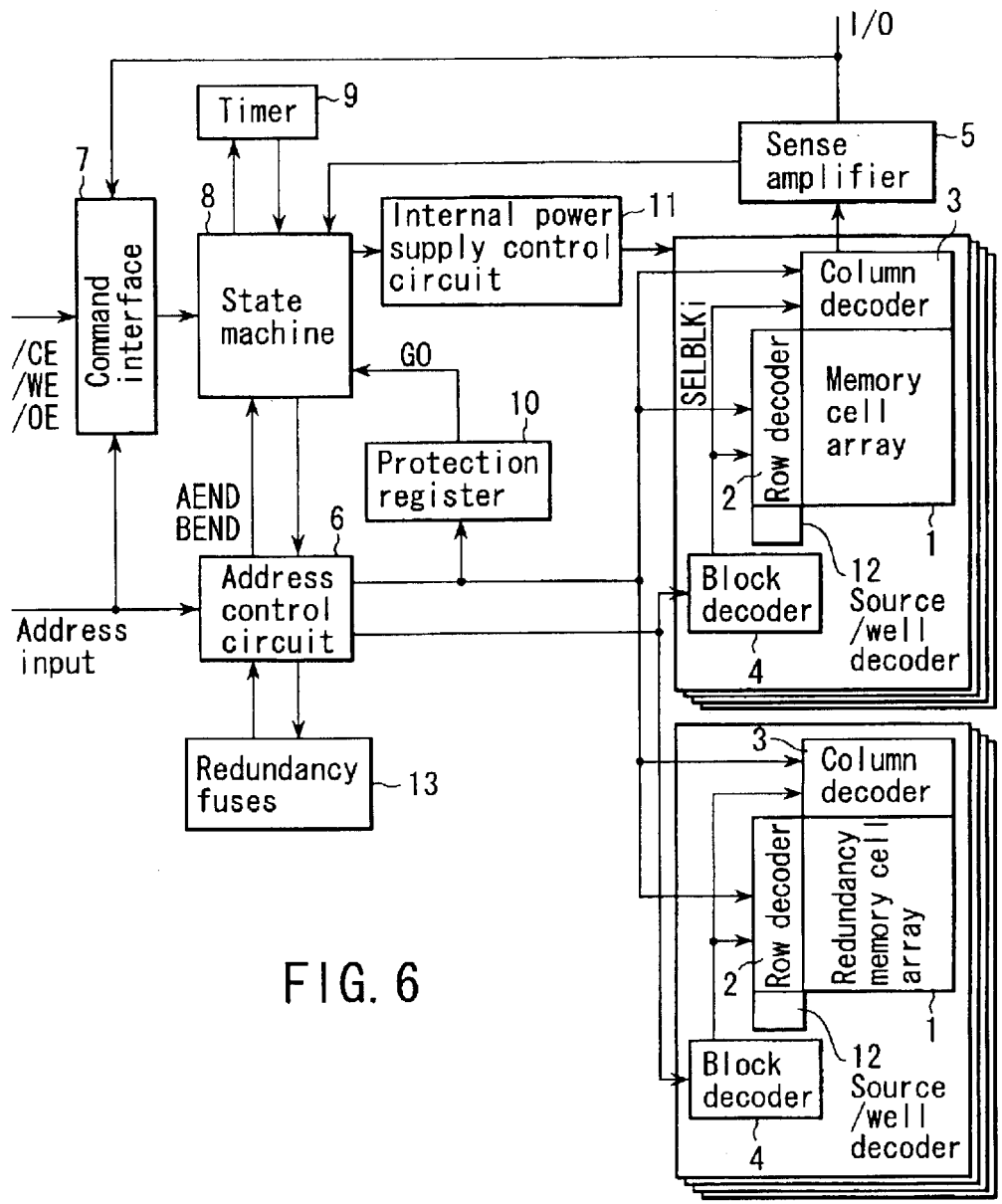
FIG. 6 is a block diagram for showing a configuration of a non-volatile semiconductor memory device according to a second embodiment.

A block redundancy configuration is shown in FIG. 6. A redundancy fuse 13, that is, an address holding element, which stores addresses of blocks to be replaced is compared to an address of a selected block by the address control circuit 6 and, if they are same, an address of a corresponding redundant block is replaced and transferred to the block decoder 4 for this redundant block.

In a case where a faulty block is replaced by a redundant block using block redundancy, the erase must be executed for the redundancy block thus replaced. Therefore, independently of the original block, the block decoder 4 for each redundant block also needs to be provided with the erase selection latch made up of G2 and I6 of FIG. 3. If a faulty block is selected in pre-programming, the block selection signal SELBLK$_i$ is replaced by a redundant block in accordance with information of the redundancy fuse of FIG. 6, to execute pre-programming.

At this time, "H" is latched in the erase selection latch of the corresponding redundant block. In the subsequent operations, as in the case of the first embodiment, the MULTIBLK signal for block selection in the erase is turned "H" to simultaneously apply an erasing bias only to the redundant block selected to undergo the erase.

According to the second embodiment, data stored in a plurality of blocks including the selected redundant blocks can be erased collectively, thus completing an erase sequence involving the redundant blocks also for a short time.

The following will further describe a third embodiment.

To erase data stored in a plurality of blocks collectively, it is necessary to simultaneously apply a bias to an extremely large number of memory cells of the plurality of blocks. Therefore, if an erase potential is simultaneously charged and discharged, an internal potential may be changed greatly by a peak current.

Figure 7A:
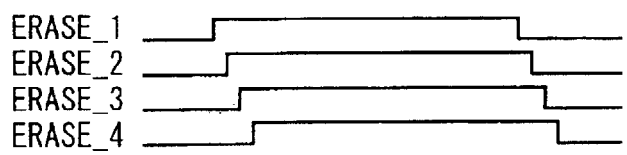
FIGS. 7A and 7B are time charts for showing an ERASE pulse for a non-volatile semiconductor memory device according to a third embodiment.

To avoid this trouble, the blocks are divided into a few groups as shown in FIG. 7A to shift erase pulses, thus reducing the magnitude of the peak current. By shifting the charging/discharging timing by 0.1–1.0 μs for an erase pulse application time of 1–10 ms, the peak current can be suppressed sufficiently.

Figure 7B:
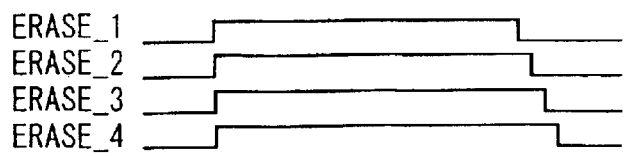

To shift only the reset operation in the erase ending, only the pulse ends of the erase pulse voltages may be shifted as shown in FIG. 7B. In this case, a shift of the pulses is very small as compared to the application time of the erase bias, so that a change is negligible in magnitude of a threshold caused by a difference in the erase time.

According to the third embodiment, since a change is suppressed in magnitude of an internal voltage caused by the peak current which occurs when a plurality of blocks is erased collectively, the collective erase can be made uniform.

The following will describe a fourth embodiment.

If the erase bias is applied collectively to all blocks in a chip, a fluctuation in erasure characteristics of memory cells may cause a post-erasure threshold voltage to vary from one block to another greatly. Therefore, in the present embodiment, the blocks in the chip is divided into a few groups so that the erase bias is applied collectively to a plurality of blocks which are selected in each of the groups.

Figure 8:
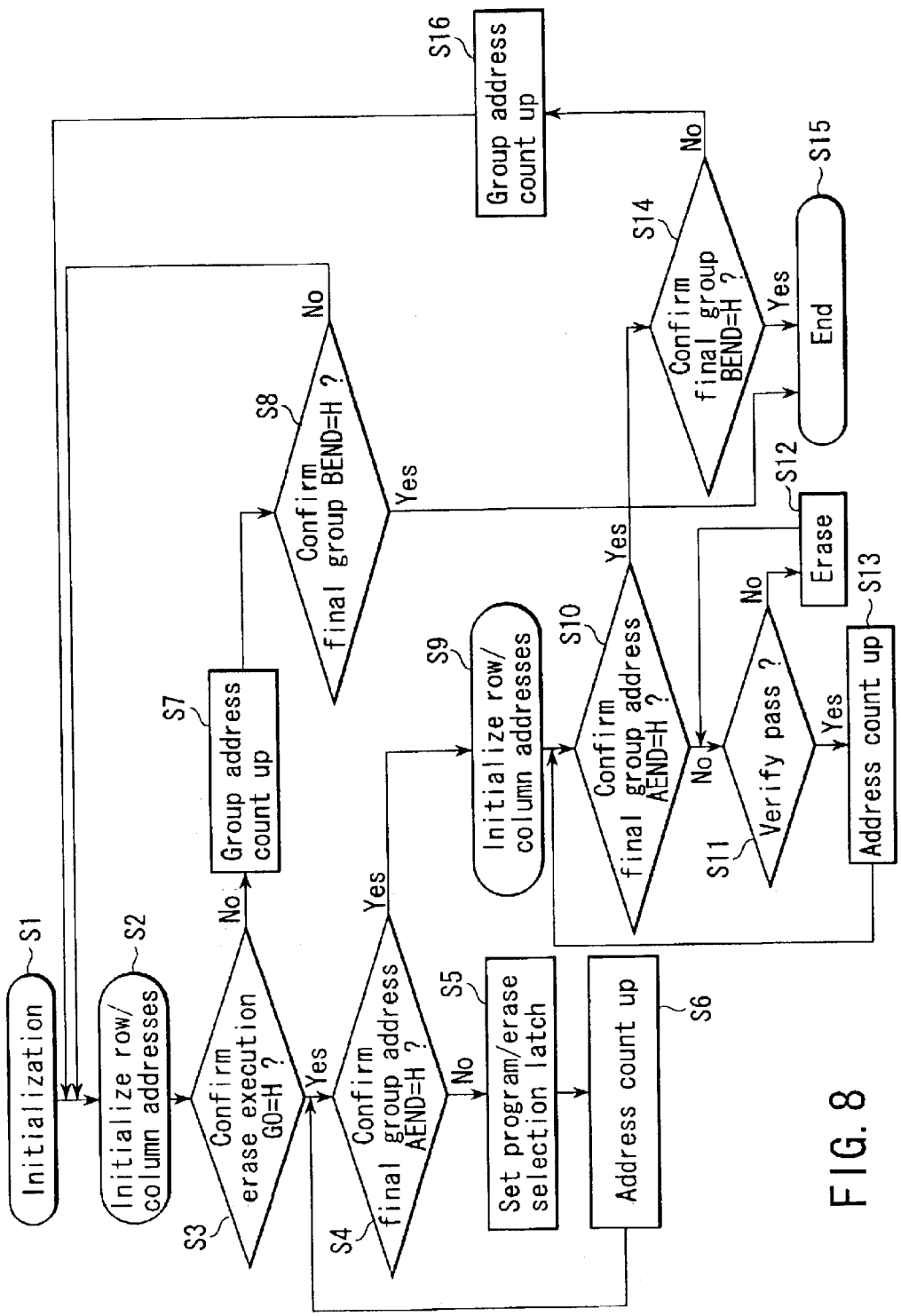
FIG. 8 is a flowchart for showing an erase sequence according to a fourth embodiment.

This erase sequence is shown in FIG. 8.

That is, receiving a command for erase instruction, the initialization is carried out at step S1. At step S2, row/column addresses in a first group are initialized at step S2 and also the potential of the internal power-supply control circuit 11 of FIG. 2 is controlled to a programming potential as in the case of FIG. 5.

At step S3 for erase execution confirmation, it is confirmed whether each group including a plurality of blocks is erased or not. As in the case of FIG. 5, comparing data of the protection register 10 (which is typically made up of an fuse element) shown in FIG. 2 with an address of a selected block, GO=H is sent from the protection register 10 to the state machine 8. When GO=H is given, pre-programming is executed.

Thereafter, the process goes along step S4 for confirmation of a final address in the group, step S5 for setting a program and an erase selection latch, and step S6 for address count-up, thereby to count up row/column addresses in this order, thus pre-programming all the memory cells in the group sequentially. At this time, "H" is latched to the erase selection latch of the block decoder 4 of FIG. 2 provided for each block. That is, a flag is added to the relevant block.

When all the blocks in the selected group are pre-programmed completely in such a manner, "H" is latched in the erase selection latch only for such a block as to undergo the erase.

If this group need not be pre-programmed, the process moves from step S3 for erase execution confirmation to step S7 for group address count-up and then to step S8. The pre-programming of each of the groups is then executed until the final group is confirmed.

When the pre-programming in the groups is finished, AEND=H is established at step S4. The collective pre-programming in each of the groups is then carried out.

The process goes along step S9 for row/column address initialization and step S10 for confirmation of the final block address of the final group thereby to repeat step S11 for verification, step S12 for erase, and step S13 for address count-up. When AEND=H is established, the process moves to step S14 for final group confirmation, and the erase is completed at the step 15 by the confirmation signal BEND. If the final group is yet to be confirmed, the process moves to step S16 for group address count-up and returns to step S2 to execute the pre-programming process and the erase process as described above.

At step S12 for erase execution, the erasing bias as shown in FIG. 14B is applied to the memory cells. For this purpose, all of the rows/columns are kept at an unselected state and the MULTIBLK signal for block selection is turned "H". Thus, the block selection signal SELBLK$_i$ becomes "H" for all blocks for which "H" is latched in the erase selection latch made up of G2 and I6 shown in FIG. 3.

In this case, the source/well decoder 12 shown in FIG. 4 transfers an internal boosted potential of the internal power-supply control circuit 11 shown in FIG. 2 only to those blocks for which SELBLK$_i$ has been turned "H". Therefore, only the erase-selected blocks are supplied with the erasing bias. In such a manner, a plurality of blocks selected to erase can be erased collectively.

It is to be noted that data erase is executed as verifying the memory cells for each bit at step S11 of FIG. 8. In read-out for verification, if even one bit of memory cell is found not to be in an erased state, the collective erase is executed again on the plurality of blocks selected to erase. The final group is confirmed at step S14 and the erase sequence of FIG. 8 is ended.

As is clear from description of the above-mentioned steps, in the present embodiment, in pre-programming of each group, as at step S3, the process surely confirms the execution of erase of each group and, if a given group need not be pre-programmed, skips this group to go to the next group.

Thus, according to the fourth embodiment, a plurality of selected groups can be erased collectively, thereby completing the erase sequence for a short time.

The following will describe a configuration of an address control circuit which corresponds to the erase sequence of the fourth embodiment. First, an address control circuit for a conventional erase sequence according to which each block undergoes the pre-programming and the simultaneous erase and read-out for verification repetitively is described with reference to FIGS. 9A, 9B, and 10.

Figures 9A, 9B:
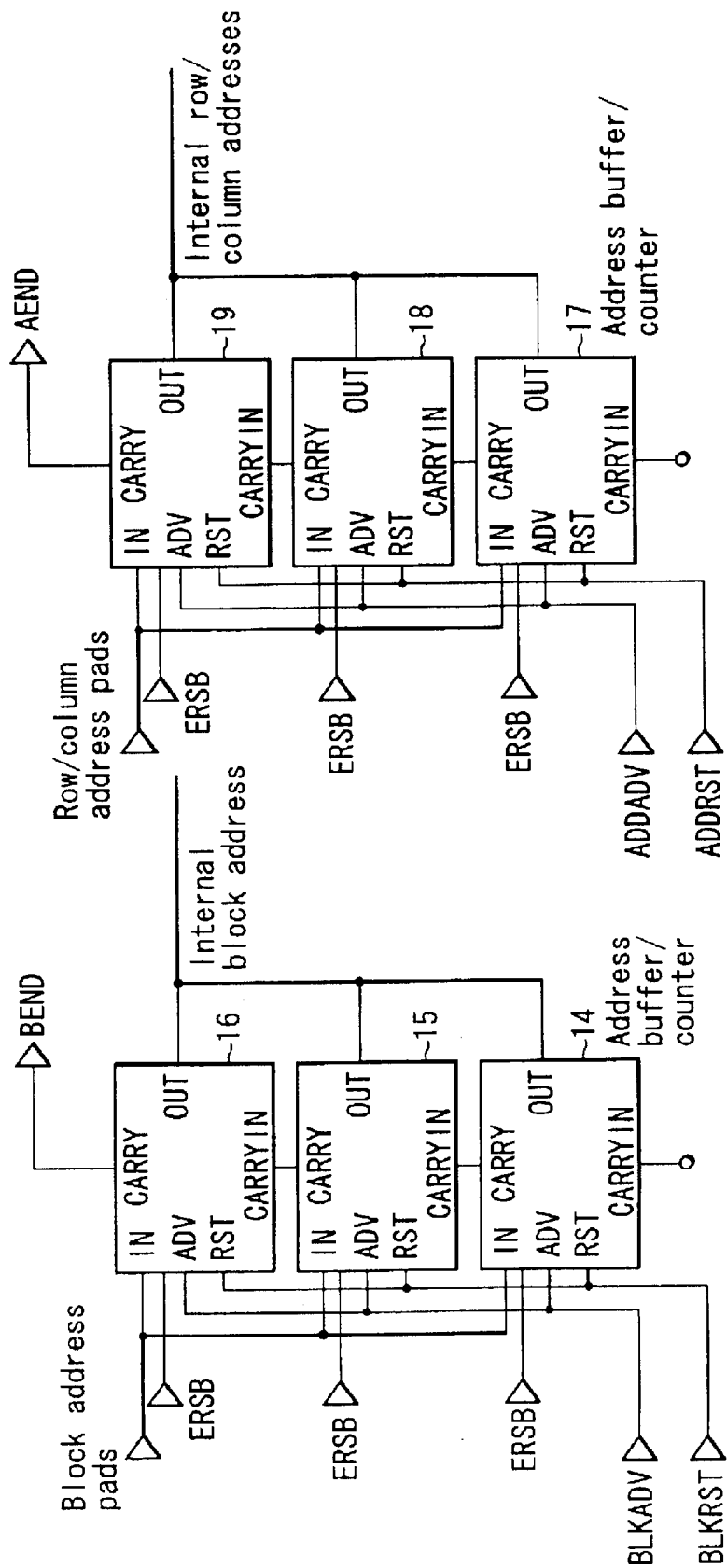
FIGS. 9A and 9B are block diagrams for showing an address control circuit for a non-volatile semiconductor memory device for a conventional erase sequence.
Figure 10:
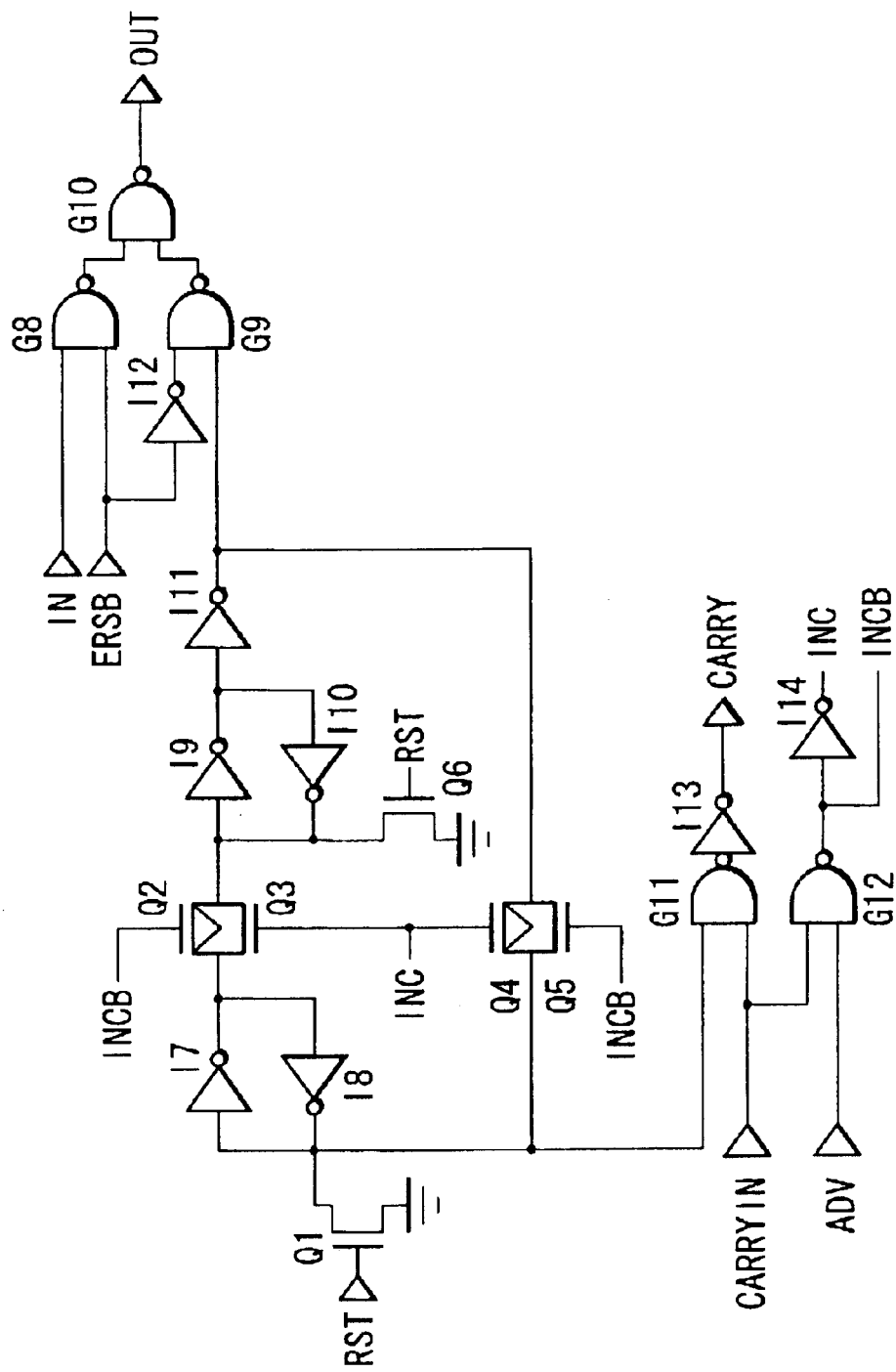
FIG. 10 is a diagram for showing a configuration of an address buffer/counter circuit of the non-volatile semiconductor memory device for the conventional erase sequence.

FIG. 9A shows a configuration of an address control circuit which counts up block addresses. For example, addresses of eight blocks are counted up by three-stage address buffers/counters 14, 15, and 16. One example of a configuration of the address buffer/counter circuit is shown in FIG. 10.

The address buffer/counter comprises: a binary counter including a transistor Q1 which receives a RESET signal, first and second latches made up of inverters I7–I10, first and second transfer gates made up of transistors Q2–Q5, and an inverter I11; a multiplexer including NAND gates G8–G10 and an inverter I12; a carry circuit including NAND gates G11 and G12 and inverters I13 and I14; and an input portion which receives a clock signal ADV for count-up.

The address buffer/counter receives the count-up clock signal ADV to generate signals INC and INCB for operating the binary counter, thus outputting an output signal OUT which advances an internal address by one bit from the multiplexer which receives a signal ERSB which is held to "L" during a sequence of FIG. 5, an input IN provided from an address pad, and an output of the binary counter. Furthermore, the carry circuit generates a signal CARRY each time the internal address is carried.

In such a manner, in the block address control circuit shown in FIG. 9A, an internal block address which is advanced by one bit each time the count-up clock signal ADV is received is output to a data bus as the output signal OUT of the address buffers/counters 14, 15, and 16.

Furthermore, each time carry occurs due to count-up of the block address, the signal CARRY of the address buffer/counter 14 of the least significant bit (LSB) is sent sequentially up to the address buffer/counter 16 of the most significant bit (MSB), so that the signal CARRY of the MSB address buffer/counter 16 can be used as a determination signal BEND which indicates that the block addresses have been counted up to the final address.

Similarly, in a row/column address control circuit shown in FIG. 9B, an internal row/column address which is advanced by one bit each time the count-up clock signal ADV is received is output to a data bus as an output signal OUT of address buffers/counters 17, 18, and 19, so that a signal CARRY of the MSB address buffer/counter 19 can be-used as a determination signal AEND which indicates that the row/column addresses have been counted up to the final address.

By using the address control circuit shown in FIGS. 9A, 9B, and 10, it is possible to accommodate the conventional erase sequence which repeats pre-programming and simultaneous erase and read-out for verification for each block.

Figure 11:
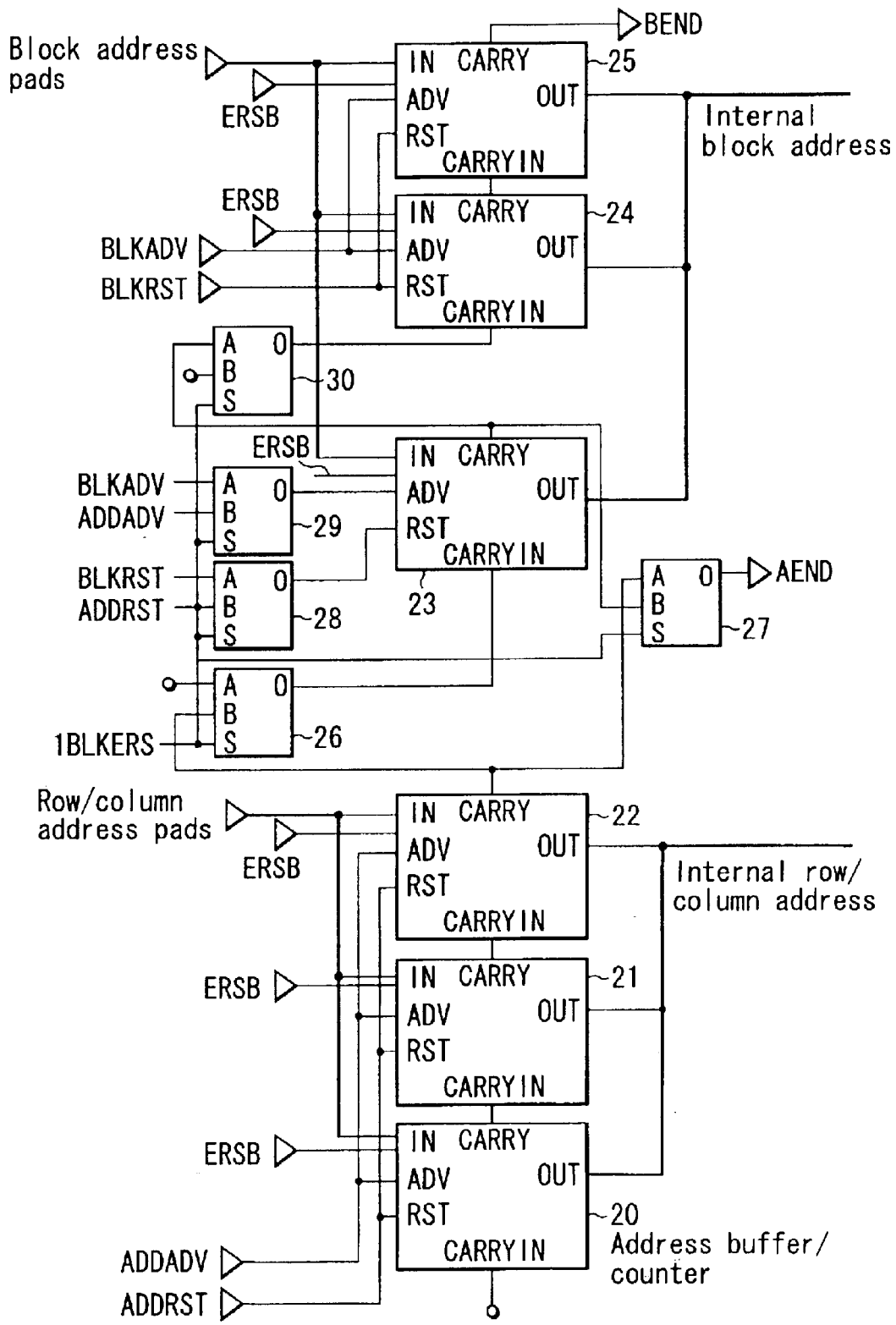
FIG. 11 is a block diagram for showing an address control circuit which implements the fourth embodiment.

The following will describe, with reference to FIG. 11, a configuration of an address control circuit which corresponds to an erase sequence according to the fourth embodiment, in which blocks in a chip are divided into a few groups so that an erasing bias may be applied collectively to a plurality of blocks in each group which are selected to undergo data erasure.

An address control circuit shown in FIG. 11 has a configuration that an output terminal of an MSB signal CARRY in address buffers/counters 20, 21, and 22 for row/column addresses is interconnected with signals CARRY IN and CARRY of address buffers/counters 23, 24, and 25 for block addresses via multiplexers 26-30. In the multiplexers 26-30 having this configuration, when a select signal S is at "H", an input A is connected to an output O, while when the select signal S is at "L", an input B is connected to the output O.

If, for example, the address control circuit shown in FIG. 11 is used to erase data for each block conventionally, this address control circuit shown in FIG. 11 is equal to that shown in FIGS. 9A and 9B by turning "H" a signal 1BLK-ERS.

That is, when the row/column addresses are all counted up, AEND=H is established, while on the other hand when the blocks are once reset (all "0" state) and then selected one by one in accordance with a block count-up clock signal BLKADV until the final block is selected, BEND=H is established.

In collective erase of a plurality of groups according to the fourth embodiment, 1BLKERS of FIG. 11 is set to "L". By a method of connecting the multiplexers 26–30 shown in FIG. 11, only the CARRY signal of the address buffer/counter 23 corresponding to one bit of the LSB block address is connected to the CARRY signal of the MSB of the address buffer/counters 20, 21, and 22 for row/column addresses, so that the present address control circuit is adapted to accommodate collective application of an erasing bias to each two groups.

A row address, a column address, and a low-order one bit of a block address are used as one group to count up addresses, and when all of them are selected, AEND=H is established.

Therefore, according to the erase sequence of FIG. 8, after given two groups are pre-programmed completely, the erase subsequence is accomplished. Therefore, "H" is latched in the erase selection latch for both of the two groups, so that these two groups are supplied with the erasing bias simultaneously. In this case, the determination of erase execution must be carried out each time the LSB of the block address is changed.

In such a manner, by using the address control circuit shown in FIG. 11, it is possible to accommodate the fourth embodiment which divides the blocks in the chip into a few groups so that the erasing bias can be applied simultaneously to a plurality of blocks in a group which are selected to undergo the erase.

Figure 12:
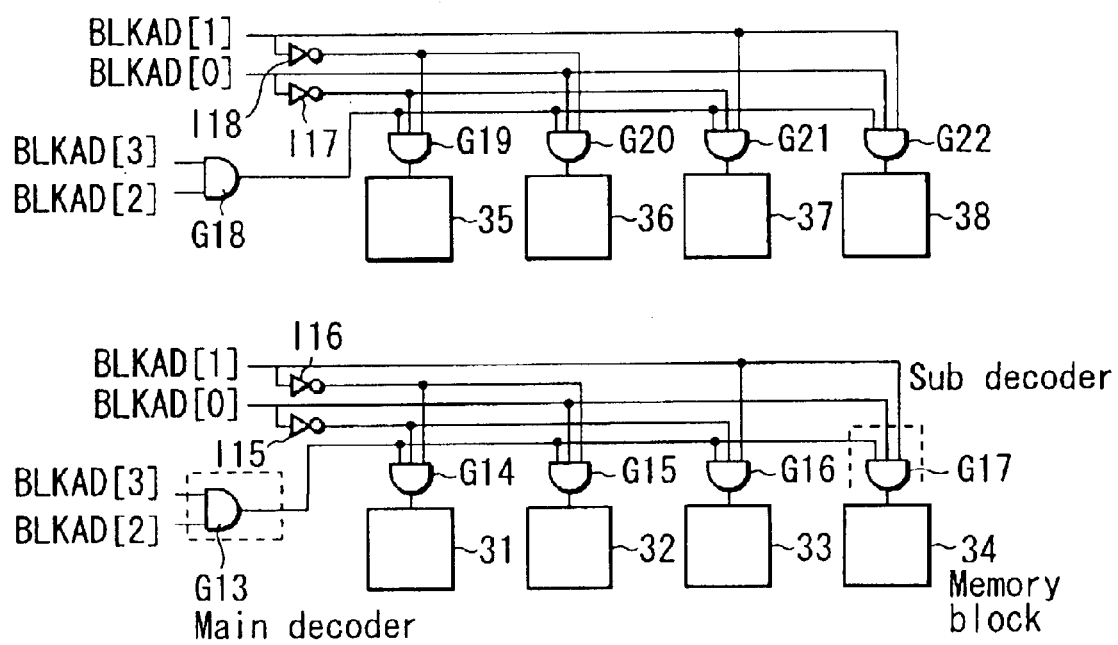
FIG. 12 is a block diagram for showing a two-stage decoding system which implements the fourth embodiment.

Grouping for simultaneous erase is made in such a manner as to match a decoder configuration. FIG. 12 shows a decoding configuration of a two-stage decoding system comprising a main decoder and a sub-decoder. The two-stage decoding system shown in FIG. 12 comprises memory blocks 31-34, a main decoder G13, sub-decoders G14–G17, and inverters I15 and I16. A similar configuration is repeated as shown at an upper stage of FIG. 12.

To employ a two-stage decoding system comprising the main decoder G13 and the sub-decoders G14–G17, collective erase can be executed on each four blocks because memory cells are grouped in units of four blocks which are selected by the main decoder using, for example, low-order two bits of a block address (BLKAD[0], BLKAD[1]).

Thus, it is possible to switch not only the addresses but also the internal power supply for each main decoder, thereby reducing a load capacity of the internal power supply as compared to a case of full-chip biasing. In a flash memory, typically a step-up circuit utilizing charge pumping is used as the internal power supply, so that the area of the chip can be reduced by arranging the internal power supply also for each main decoder.

The following will describe a fifth embodiment.

Figure 14C:
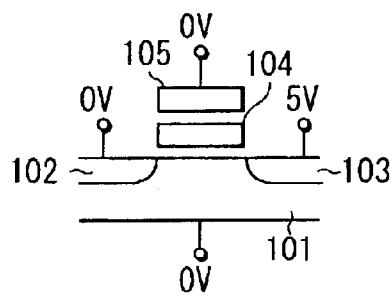

Specifically, the following will describe how to reduce the time required for the erase sequence by simultaneously biasing bit lines of a plurality of blocks in a case where weak programming is executed on an over-erased cell by biasing the bit lines using a convergence bias shown in FIG. 14C in a condition where all the word lines are in an unselected state.

Self-convergence is different from selective programming involving verification for each bit and, therefore, can be executed in a way similar to that of collective erase of a plurality of blocks by biasing columns of a plurality of blocks simultaneously.

As in the case of collective erase of a plurality of blocks, in self-convergence also, the MULTIBLK signal for block selection is turned "H" to simultaneously select columns corresponding to a plurality of blocks which are selected to undergo the erase. A convergence bias shown in FIG. 14C is applied simultaneously to these selected columns, thereby making it possible to collectively execute self-convergence programming on the over-erased cells of the selected columns.

In such a manner, according to the fifth embodiment, in the case of self-convergence programming also, the required time of the erase sequence can be reduced by applying the convergence bias simultaneously to the corresponding columns of a plurality of blocks.

Although an address control circuit using a binary counter, a carry circuit, and a multiplexer in, for example, the fourth embodiment has been described, the present invention is not limited thereto. Other circuit configurations may be used to implement the same functions.

Furthermore, although the non-volatile semiconductor device has been described as a NOR-type flash memory, its application is not limited thereto; for example, it is applicable also to a flash memory of an AND type, a NAND type, a DINOR type, etc.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general invention concept as defined by the appended claims and their equivalents.

What is claimed is:

1. A non-volatile semiconductor memory device comprising:
    a plurality of blocks each having a plurality of memory cells to be erased at a time and a decoder for selecting the memory cells, each of the blocks having a block decoder for latching a selection signal thereof in pre-programming and for selecting all of the latched blocks by the selection signal at the same time;
    a sense amplifier; and
    an address control circuit for controlling a sequence, the sequence including counting addresses of the memory cells in erasing and erasing all of the selected memory cells after pre-programming, all of the blocks having the latched selection signal being controlled to be collectively erased by the address control circuit.

2. The non-volatile semiconductor memory device according to claim 1, wherein when all of the blocks having the latched selection signal is collectively erased, a time for applying an erasing bias is increase as compared to a case of erasing one block.

3. The non-volatile semiconductor memory device according to claim 1, wherein when all of the blocks having the latched selection signal is collectively erased, a point of time for applying the erasing bias is shifted for each of the blocks.

4. The non-volatile semiconductor memory device according to claim 1, further including:
    redundant blocks for replacing faulty blocks, each of the redundant blocks having a block decoder for latching a selection signal thereof in the pre-programming and for selecting all of the redundant blocks having the latched selection signal at the same time;
    a faulty block address holding element for replacing block addresses with those of the redundant blocks when accessed to the faulty blocks; and
    all of the redundant blocks having the latched selection signal and the all of the blocks having the latched selection signal being controlled by the address control circuit to be collectively erased.

5. The non-volatile semiconductor memory device according to claim 1, further including:
    a circuit for selecting a column of the memory cells to apply a program voltage thereto after erasing the blocks collectively, and for carrying out weak programming for the memory cells connected to the column at the same time; and
    the circuit having a function for carrying out the weak programming for all of the collectively erased blocks, using the column selected by same column address in all of the blocks having the latched selection signal.

6. A non-volatile semiconductor memory device comprising:
    a plurality of blocks each having a plurality of memory cells to be erased at a time and a decoder for selecting the memory cells, each of the blocks having a block decoder for latching a selection signal thereof in pre-programming and for selecting all of the latched blocks by the selection signal at the same time;
    a sense amplifier; and
    an address control circuit for controlling a sequence, the sequence including counting addresses of the memory cells in erasing and erasing all of the selected memory cells in a predetermined number of blocks after pre-programming, the predetermined number of the blocks having the latched selection signal being controlled to be collectively erased by the address control circuit.

7. The non-volatile semiconductor memory device according to claim 6, further including:

a circuit for selecting a column of the memory cells to apply a program voltage thereto after erasing the blocks collectively, and for carrying out weak programming for the memory cells connected to the column at the same time; and the circuit having a function for carrying out the weak programming for all of the collectively erased blocks, using the column selected by same column address in all of the blocks having the latched selection signal.

8. A method for executing an erase sequence on a non-volatile semiconductor memory device including a plurality of blocks each having a plurality of memory cells, comprising:

confirming erase execution of a first block to be pre-programmed and then pre-programming the first block;

confirming erase execution of a next block and then pre-programming the next block;

similarly confirming erase execution of further next blocks one by one and then pre-programming the further next blocks one by one; and then, executing collective erase for each of the blocks.

9. The method according to claim 8, wherein if the pre-programming is not required for a relevant block, the relevant block is skipped, so that a next block is pre-programmed.

10. The method according to claim 8, wherein when all of the blocks are pre-programmed completely, a flag is added to only the blocks to be erased.

11. The method according to claim 8, wherein the plurality of blocks are divided into a plurality of groups, and a selected plurality of blocks in each of the groups.

* * * * *